US011107540B1

(12) United States Patent
Pachamuthu et al.

(10) Patent No.: US 11,107,540 B1
(45) Date of Patent: Aug. 31, 2021

(54) PROGRAM DISTURB IMPROVEMENTS IN MULTI-TIER MEMORY DEVICES INCLUDING IMPROVED NON-DATA CONDUCTIVE GATE IMPLEMENTATION

(71) Applicant: Sandisk Technologies LLC, Addison, TX (US)

(72) Inventors: Jayavel Pachamuthu, San Jose, CA (US); Dengtao Zhao, Los Gatos, CA (US)

(73) Assignee: Sandisk Technologies LLC, Addison, TX (US)

( * ) Notice: Subject to any disclaimer, the term of this patent is extended or adjusted under 35 U.S.C. 154(b) by 0 days.

(21) Appl. No.: 16/791,253

(22) Filed: Feb. 14, 2020

(51) Int. Cl.
| | |
|---|---|
| *G11C 16/08* | (2006.01) |
| *G11C 16/34* | (2006.01) |
| *H01L 21/762* | (2006.01) |
| *G11C 16/28* | (2006.01) |
| *G11C 16/12* | (2006.01) |
| *G11C 16/04* | (2006.01) |

(52) U.S. Cl.
CPC ...... *G11C 16/3427* (2013.01); *G11C 16/0483* (2013.01); *G11C 16/08* (2013.01); *G11C 16/12* (2013.01); *G11C 16/28* (2013.01); *G11C 16/3418* (2013.01); *G11C 16/3436* (2013.01); *G11C 16/3459* (2013.01); *H01L 21/762* (2013.01)

(58) Field of Classification Search
CPC ............. G11C 16/10; G11C 16/3459; G11C 16/3445; G11C 16/0483; G11C 16/14; H01L 27/11582
See application file for complete search history.

(56) References Cited

U.S. PATENT DOCUMENTS

| | | | |
|---|---|---|---|
| 8,286,994 B2 | 10/2012 | Rick | |
| 9,620,233 B1 | 4/2017 | Dong et al. | |
| 9,887,002 B1 | 2/2018 | Zhang et al. | |
| 9,922,717 B1* | 3/2018 | Maejima | G11C 16/26 |
| 10,008,277 B2 | 6/2018 | Pang et al. | |
| 10,269,435 B1* | 4/2019 | Chen | G11C 16/3427 |
| 10,276,248 B1* | 4/2019 | Lu | G11C 16/3454 |
| 10,297,330 B2 | 5/2019 | Zhang et al. | |
| 10,438,671 B1* | 10/2019 | Chen | G11C 16/12 |
| 10,559,368 B1* | 2/2020 | Yang | G11C 16/0483 |
| 10,636,500 B1* | 4/2020 | Chen | G11C 16/26 |
| 2009/0180317 A1* | 7/2009 | Kang | G11C 11/5628 365/185.2 |
| 2019/0074065 A1* | 3/2019 | Park | G11C 16/3418 |

(Continued)

*Primary Examiner* — Mushfique Siddique
(74) *Attorney, Agent, or Firm* — Morgan, Lewis & Bockius LLP

(57) ABSTRACT

Techniques for reducing program disturb of memory cells which are formed in a NAND string extending in a lower tier and an upper tier of a stack, the lower tier including a first plurality of memory cells and the upper tier including a second plurality of memory cells, wherein each memory cell of the first and second pluralities of memory cells is connected to a respective word line. The NAND string includes a joint region formed of a dielectric material and disposed between the lower tier and the upper tier of the stack; a first non-data memory cell adjacent to and below the joint region; a second non-data memory cell adjacent to and above the joint region; and a conductive gate connected to the first non-data memory cell and the second non-data memory cell.

20 Claims, 11 Drawing Sheets

(56) References Cited

U.S. PATENT DOCUMENTS

2019/0189218 A1* 6/2019 Izumi .................. G11C 16/10
2019/0198522 A1* 6/2019 Takekida .......... H01L 27/11582
2019/0378579 A1* 12/2019 Zhao .................. G11C 16/12

* cited by examiner

US 11,107,540 B1

PROGRAM DISTURB IMPROVEMENTS IN MULTI-TIER MEMORY DEVICES INCLUDING IMPROVED NON-DATA CONDUCTIVE GATE IMPLEMENTATION

RELATED APPLICATIONS

This application is related to U.S. Pat. No. 10,438,671, issued Oct. 8, 2019, which is hereby incorporated by reference in its entirety.

TECHNICAL FIELD

The present technology relates to the operation of multi-tier memory devices.

BACKGROUND

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

SUMMARY

Implementations described in this specification are directed to providing countermeasures for program disturbs associated with injection of electrons at a joint region between tiers of memory cells in a NAND string.

In one aspect, a conductive gate connects two non-data memory cells to the joint region between two tiers of memory cells to form a unitary gate or word line for the two non-data memory cells, where a first of the non-data memory cells is adjacent to and below the joint region and a second of the non-data memory cells is adjacent and above the joint region. The conductive gate forms a joint word line in electrical contact with a gate of each of the first and second non-data memory cells.

In another aspect, a control circuit ramps down a voltage of the joint word line during a first time interval subsequent to a program verify phase of a program function, and ramps down a voltage of one or more non-joint word lines connected to one or more respective memory cells of the second plurality of memory cells during a second time interval subsequent to the first time interval that occurs after a delay of a non-zero time period with respect to the performing of the first voltage ramp-down operation.

Other embodiments and advantages may be apparent to those skilled in the art in light of the descriptions and drawings in this specification.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

DESCRIPTION OF IMPLEMENTATIONS

Figure 1:
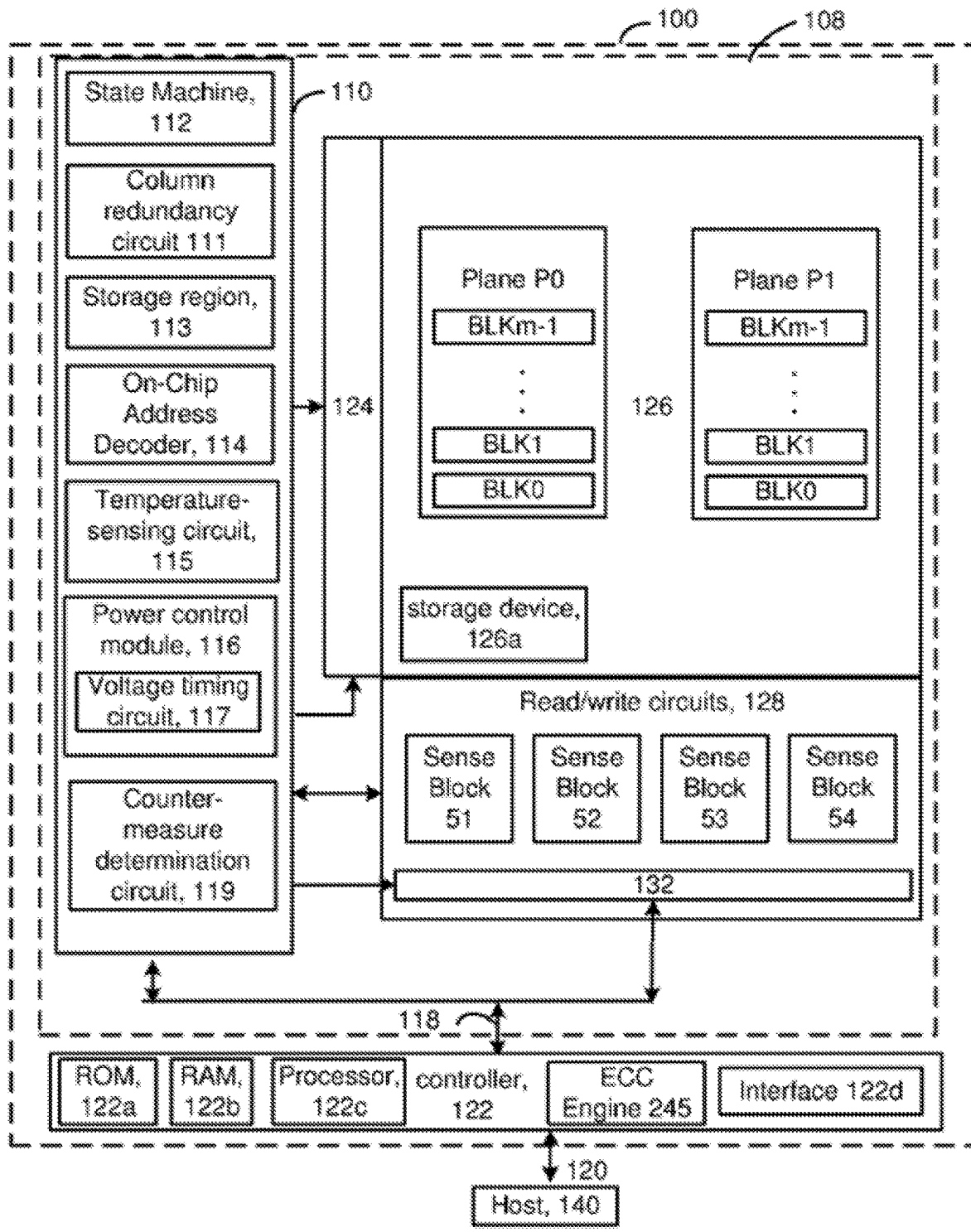
FIG. 1 is a block diagram of an example memory device in accordance with some implementations.

Apparatuses and techniques are described for reducing program disturb in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts as a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations.

Verify tests may be performed after each program voltage to determine whether the memory cells have completed programming. A verify test can involve applying a control gate voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A-G data states (see FIG. 7). In a four-bit per cell memory device, there are sixteen data states including the erased state (S0) and fifteen higher data states (S0-S15).

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

However, program disturb can occur for some 3D memory structures in which the memory cells are arranged in vertical NAND strings (or other sets of connected memory cells) in a stack, where the stack comprises alternating conductive and dielectric layers. In this structure, the conductive layers act as word lines which are connected to the memory cells. Each NAND string may have the shape of a pillar which intersects with the word lines to form the memory cells. Due to a desire to increase the height of the stack to allow for more layers and more memory cells in each NAND string, it becomes more difficult to etch low aspect ratio memory holes in which the NAND strings are formed. One approach is to form the stack and memory holes in two (or more) tiers. For example, FIG. 3 which depicts word lines WLDL and WLDU adjacent to an interface (IF). The memory hole is etched separately in each tier so that a low aspect ratio can be achieved. However, the dielectric layer or region at the interface (IF) between the tiers is relatively thicker than the other dielectric layers. As a result, the distance between memory cells which are adjacent to the interface will be greater than the other inter-cell distances.

Because of this increased distance, the channel region at the interface tends to be less conductive than other channel regions when a pass voltage is applied to the word lines. The conductivity of the channel region at the interface depends on the strength of a fringing electric field from the word lines which are adjacent to the interface. However, the voltage of these word lines cannot be increased to a high level to increase the fringing field because this may cause program disturb for the associated memory cells. As a result, in the program phase of a program loop, residue electrons which are initially below the interface, in the lower tier, will require a relatively long time to travel to the drain end of the NAND string compared to residue electrons which are initially above the interface, in the upper tier. The residue electrons are attracted to the drain side of the unselected NAND string when a positive bit line voltage is applied. The selected word line voltage is relatively high by the time the lower tier residue electrons reach the upper tier, due to the delay in the residue electrons moving through the interface. This word line voltage attracts the electrons into the charge trapping layer of the memory cell connected to the selected word line, causing a hot electron injection type of program disturb. This type of program disturb generally affects memory cells in unselected NAND strings in the upper tier of a two-tier stack.

If a stack had more than two tiers, the program disturb can affect memory cells in each of the tiers which are above the bottommost tier.

Another factor in the program disturb is a channel gradient which may be formed between the selected word line and the adjacent word line, depending on the data pattern. In some cases, a relatively large channel gradient may be formed which accelerates the residue electrons to facilitate their movement into the charge trapping layer of the memory cell.

Techniques provided herein address the above and other issues.

In one aspect, a conductive gate connects two non-data memory cells to a joint region between two tiers of memory cells, where a first of the non-data memory cells is adjacent to and below the joint region and a second of the non-data memory cells is adjacent and above the joint region. The conductive gate forms a joint word line in electrical contact with a gate of each of the first and second non-data memory cells.

In another aspect, a control circuit ramps down a voltage of the joint word line during a first time interval subsequent to a program verify phase of a program function, and ramps down a voltage of one or more non-joint word lines connected to one or more respective memory cells of the second plurality of memory cells during a second time interval subsequent to the first time interval that occurs after a delay of a non-zero time period with respect to the performing of the first voltage ramp-down operation.

The program disturb countermeasures discussed above can be selectively implemented as a function of a position of the selected word line in the stack. This helps minimize any delays. For example, a countermeasure can be implemented when the selected word line is in the upper tier but not the lower tier. In another approach, a countermeasure can be implemented when the selected word line is in the upper tier and is separated from the interface by at least one other data word line. In another approach, a countermeasure can be implemented when the selected word line is in the bottom half or other lower part of the upper tier since this part of the upper tier may be more susceptible to the injection type of program disturb than an upper part of the upper tier.

These and other features are discussed further below.

FIG. 1 is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprises blocks of memory cells arranged in one or more planes. For example, blocks BLK0-BLKm−1 are arranged in each of planes P0 and P1. A plane may be an area of a substrate with a diffusion layer which is common to each block in the plane, in one approach. The blocks in a plane typically share a common set of bit lines.

The read/write circuits 128 include multiple sense blocks 51-54 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via a path 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a column redundancy circuit 111, an on-chip address decoder 114, a temperature-sensing circuit 115, a power control module 116 (power control circuit) and a countermeasure determination circuit 119. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The column redundancy circuit provides a mapping between spare NAND strings which replace defective primary NAND strings. The on-chip address decoder 114 provides an address interface between that used by the host or a memory controller to the hardware address used by the decoders 124 and 132. The temperature-sensing circuit 115 can be used to determine a temperature, and the temperature in turn can be used by the voltage timing circuit to determine a delay. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach.

The power control module can include a voltage timing circuit 117 which stores data used in determining when to apply voltage signals. For example, the data can indicate an amount of a delay in increasing voltages of non-interface unselected word lines relative to an increase in voltages of interface unselected word lines, as a program disturb countermeasure. The delay can be implemented at the start of a program phase of a program loop, for example.

The voltage timing circuit 117 may be configured with hardware, firmware and/or software for performing the techniques described herein including the processes of the flowcharts described herein.

The countermeasure determination circuit may determine whether to implement a program disturb countermeasure, and what type of countermeasure to implement based on factors such as the selected word line position (WL_sel) and the temperature. For example, the circuit may obtain an identifier of WL_sel from the address provided in a program command, and decide whether WL_sel is within a specified range of word lines for which a countermeasure should be performed.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, temperature-sensing circuit 115, power control module 116, countermeasure determination circuit 119, sense blocks 51-54, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the processes described herein, including the processes of the flowcharts described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in they direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
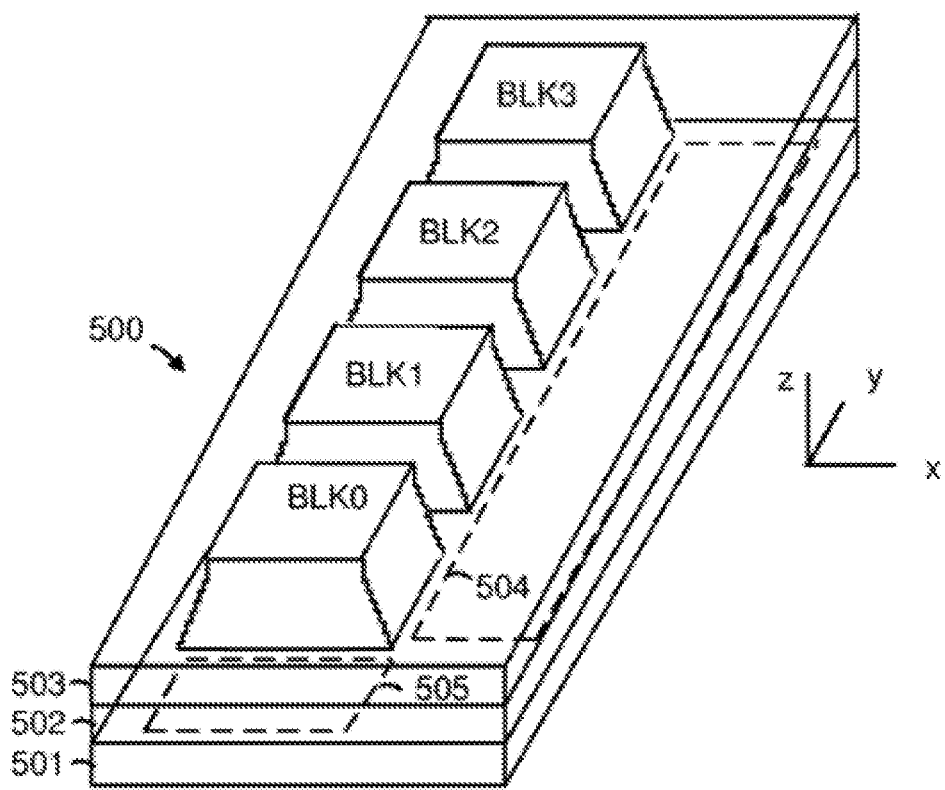
FIG. 2 is a perspective view of a memory device comprising a set of blocks in an example 3D configuration of the memory structure of FIG. 1.

FIG. 2 is a perspective view of a memory device 500 comprising a set of blocks in an example 3D configuration of the memory structure 126 of FIG. 1. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 3:
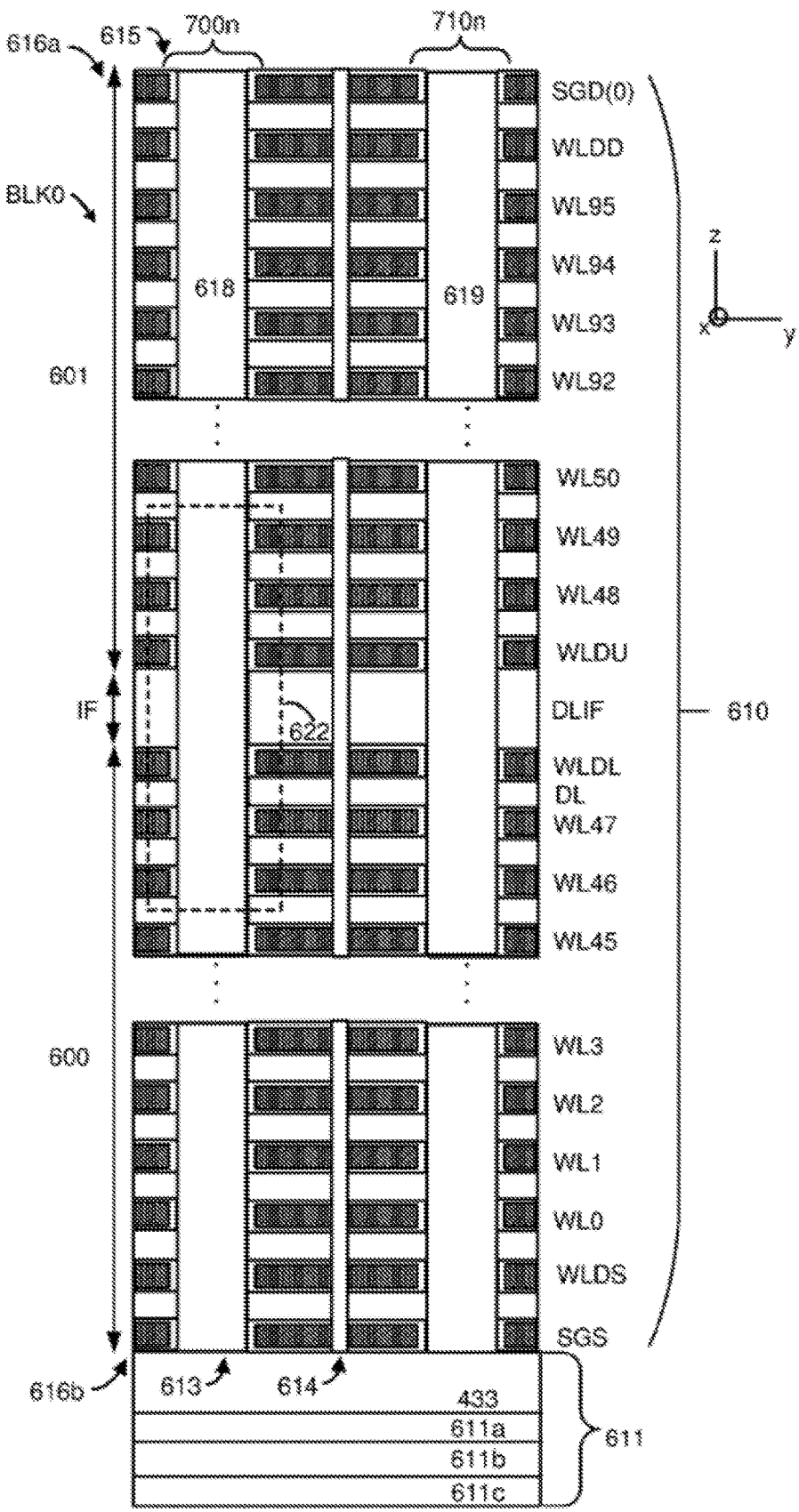
FIG. 3 depicts an example cross-sectional view of a portion of BLK0 of FIG. 2, including NAND strings 700n and 710n.

FIG. 3 depicts an example cross-sectional view of a portion of BLK0 of FIG. 2, including NAND strings 700n and 710n.

The block comprises a stack 610 of alternating conductive and dielectric layers in two tiers including a lower tier 600 (e.g., a first tier or a bottom tier) and an upper tier 601 (e.g., a second tier or a top tier).

The tiers are separated by an interface (IF) (also referred to as an interface region, junction, joint or joint region) which is formed of dielectric material.

The conductive layers comprise SGS, WLDS, WL0-WL47, WLDL, WLDU, WL48-WL95, WLDD and SGD(0). In some embodiments (e.g., FIGS. 8A-8B), the conductive layers additionally or alternatively comprise SGSB, WLDS0, WLDS1, DD1, DD0, SGD0, SDG1, and SDG2.

WLDS, WLDL, WLDU and WLDD are dummy word lines or conductive layers connected to dummy memory cells which are ineligible to store user data, WL0-WL47 are data word lines or conductive layers in the lower tier connected to data memory cells which are eligible to store user data, and WL48-WL95 are data word lines or conductive layers in the upper tier connected to data memory cells which are eligible to store user data. As an example only, the stack includes 96 data word lines (WL0-WL95), and the data word lines are evenly divided between the two tiers.

DL is an example dielectric layer outside the interface, and DLIF is a dielectric layer of the interface.

WLDL and WLDU are examples of unselected word lines adjacent to the interface, and WL0-WL47 and WL48-WL95 are examples of unselected word lines non-adjacent to the interface in the lower and upper tiers, respectively.

The NAND strings each comprise a memory hole 618 or 619, respectively, which is filled with materials which form memory cells adjacent to the word lines. For example, see region 622 of the stack which is shown in greater detail in FIG. 4.

The stack is formed on a substrate 611. In one approach, a well region 433 is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source-end 613 at a bottom 616b of the stack 610 and a drain-end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain-ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

Figure 4:
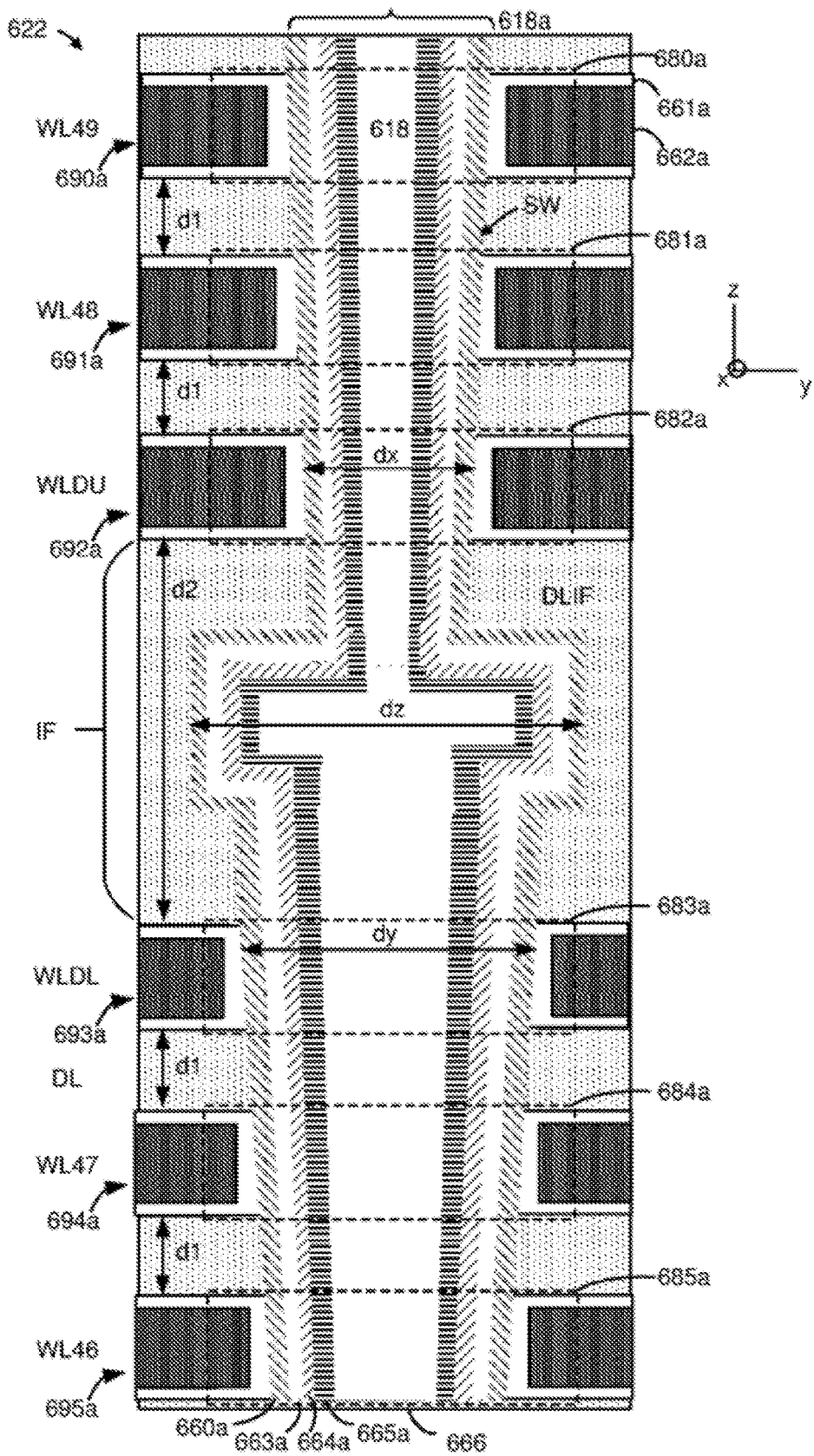
FIG. 4 depicts a close-up view of the region 622 of the stack of FIG. 3.

FIG. 4 depicts a close-up view of the region 622 of the stack of FIG. 3. The region includes the three word lines below the interface, WL46, WL47 and WLDL, and the three word lines above the interface, WLDU, WL48 and WL49. Generally, the NAND string comprises memory cells connected to respective word lines. This example includes memory cells 680a, 681a, 682a, 683a, 684a and 685a connected to word lines WL49, WL48, WLDU, WLDL, WL47 and WL46, respectively. The word lines or word line layers are spaced apart by dielectric layers, which each have a thickness or height of d1 (a first distance) outside the interface, and by DLIF, which has a larger thickness or height of d2 (a second distance) in the interface. Distances d1 and d2 are also inter-cell distances, or distances between adjacent memory cells along the z or vertical axis. In one approach, d2 is at least 1.5-4 times the height of d1. DLIF can be an aggregated layer which is made up of dielectric materials which are deposited in one or more separate layers on top of one another.

The memory cell 682a is connected to WLDU, and is adjacent to and above the interface. The memory cell 683a is connected to WLDL, and is adjacent to and below the interface. These are interface memory cells. The second distance d2 spans the interface. In some cases, the memory cells 682a and 683a can be set as dummy memory cells which are ineligible to store user data, due to the difficulty in controlling the channel region along the interface. WLDU and WLDL are dummy word lines in this case.

In some embodiments, the memory hole which is etched through each tier of the stack has a tapered shape, e.g., wider at the top and narrower at the bottom. As a result, the memory hole diameter dy at the top word line layer or memory cell in the bottom tier is larger than the memory hole diameter dx at the bottom word line layer or memory cell in the top tier. A diameter dz represents a widest region of the memory hole. This widened region is used to accommodate small misalignments in the memory hole portion of the top tier relative to the memory hole portion in the bottom tier. The increased thickness d2 of DLIF is provided due to process margin concerns and also accommodates misalignment by providing a transition region between the memory hole portions in the two tiers. The diameter of the memory hole thus changes abruptly partway along a height of the memory hole.

A number of layers or films can be deposited along the sidewall of the memory hole. The layers can conform to the changing diameter in the interface. For example, the layers can include a blocking oxide/block high-k material 660a, a charge-trapping layer 663a (e.g., silicon nitride (Si3N4) or other nitride), a tunneling layer 664a (e.g., oxide) and a channel 665a layer (e.g., polysilicon). A dielectric core 666 (e.g., silicon dioxide) fills a remainder of the memory hole. A pillar 618a or column can be formed by the materials within a memory hole as an active area of a NAND string. Referring to WL49 as an example, a word line layer can include a metal barrier 661a, and a conductive metal 662a as a control gate. For example, control gates 690a, 691a, 692a, 693a, 694a and 695a are provided. The NAND string can be considered to have a floating body channel because the length of the channel is not formed on a substrate. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Figure 5:
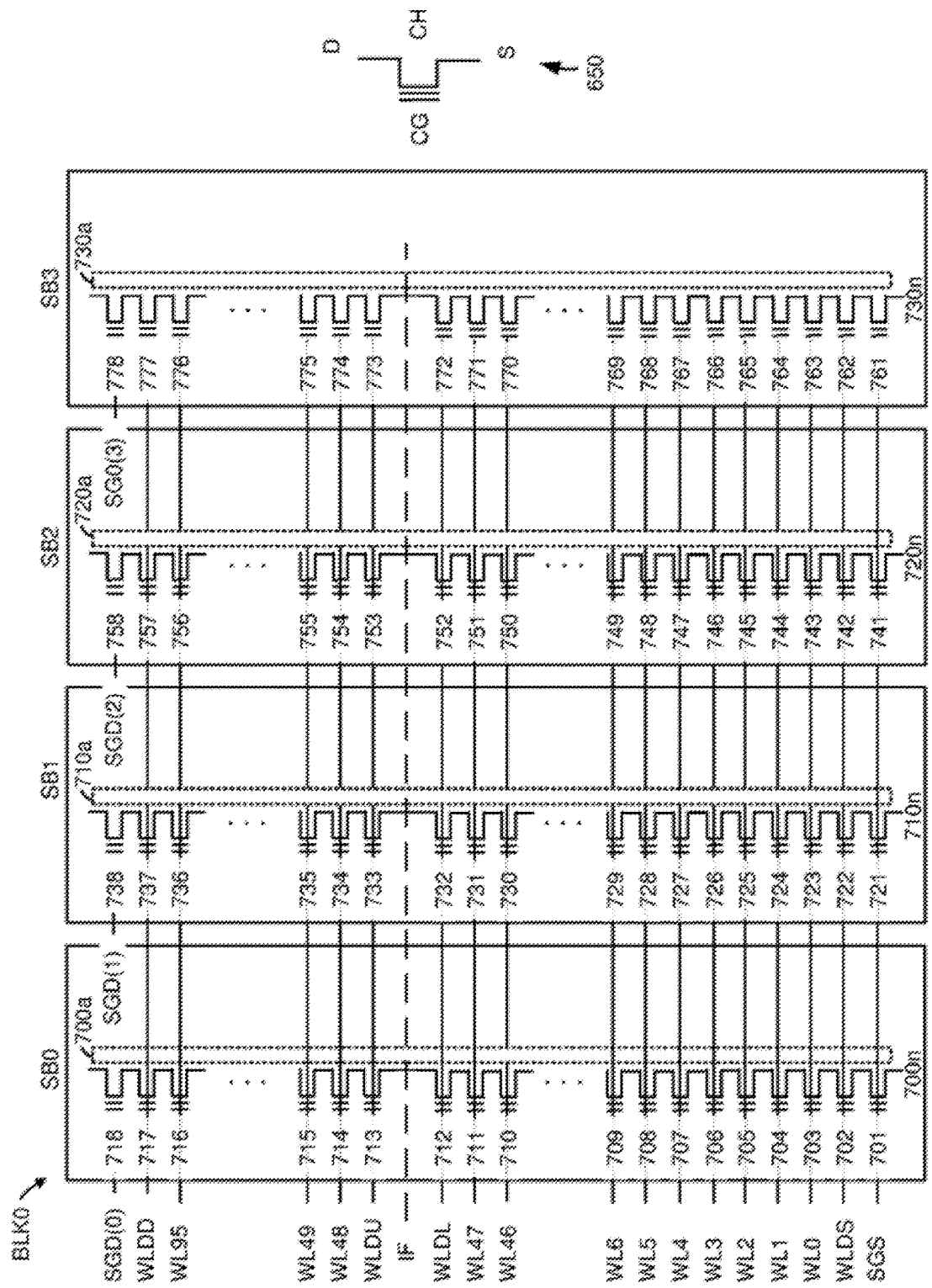
FIG. 5 depicts an example view of NAND strings in sub-blocks in a 3D configuration which is consistent with the two-tier stack of FIG. 3.

FIG. 5 depicts an example view of NAND strings in sub-blocks in a 3D configuration which is consistent with the two-tier stack of FIG. 3. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 700n, 710n, 720n and 730n, respectively. In this example, each NAND string has one SGD transistor, one drain-side dummy memory cell, 96 data memory cells (where 48 are above the interface IF, i.e., connected to WL48-WL95, and 48 are below the interface, i.e., connected to WL0-WL47), one source-side dummy memory cell and one SGS transistor.

In the block BLK0, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-end data word line and proceeding one word line at a time to WL95, the drain-end data word line.

The NAND strings 700n, 710n, 720n and 730n have channels 700a, 710a, 720a and 730a, respectively. Each channel can extend continuously from a source-end select gate transistor to a drain-end select gate transistor. For example, the channel 700a extends continuously in the NAND strings 700n from the SGS transistor 701 to the SGD transistor 718. The channel 700a is continuous in that it is uninterrupted and can therefore provide a continuous conductive path in the NAND string.

NAND string 700n includes:
SGS transistor 701,
source-side dummy memory cell 702 connected to WLDS,
lower tier data memory cells 703-711 connected to WL0-WL47, respectively,
interface-adjacent dummy memory cell 712 connected to WLDL,
interface-adjacent dummy memory cell 713 connected to WLDU,
upper tier data memory cells 714-716 connected to WL48-WL95, respectively,
drain-side dummy memory cell 717 connected to WLDD, and
SGD transistor 718 connected to SGD(0).

Similarly, NAND string 710*n* includes SGS transistor 721, source-side dummy memory cell 722 connected to WLDS, lower tier data memory cells 723-731 connected to WL0-WL47, respectively, interface-adjacent dummy memory cell 732 connected to WLDL, interface-adjacent dummy memory cell 733 connected to WLDU, upper tier data memory cells 734-736 connected to WL48-WL95, respectively, drain-side dummy memory cell 737 connected to WLDD, and SGD transistor 738 connected to SGD(1).

NAND string 720*n* includes SGS transistor 741, source-side dummy memory cell 742 connected to WLDS, lower tier data memory cells 743-751 connected to WL0-WL47, respectively, interface-adjacent dummy memory cell 752 connected to WLDL, interface-adjacent dummy memory cell 753 connected to WLDU, upper tier data memory cells 754-756 connected to WL48-WL95, respectively, drain-side dummy memory cell 757 connected to WLDD, and SGD transistor 758 connected to SGD(2).

NAND string 730*n* includes SGS transistor 761, source-side dummy memory cell 762 connected to WLDS, lower tier data memory cells 763-771 connected to WL0-WL47, respectively, interface-adjacent dummy memory cell 772 connected to WLDL, interface-adjacent dummy memory cell 773 connected to WLDU, upper tier data memory cells 774-776 connected to WL48-WL95, respectively, drain-side dummy memory cell 777 connected to WLDD, and SGD transistor 778 connected to SGD(3).

In this example, the memory cells 713, 733, 753 and 773 are adjacent to and above the interface, and the memory cells 712, 732, 752 and 772 are adjacent to and below the interface.

An example transistor 650 represents any of the memory cells or select gate transistors of FIG. 5. The transistor comprises a control gate CG, a drain D, a source S and a channel CH and may represent a memory cell or a select gate transistor, for example.

Figure 6:
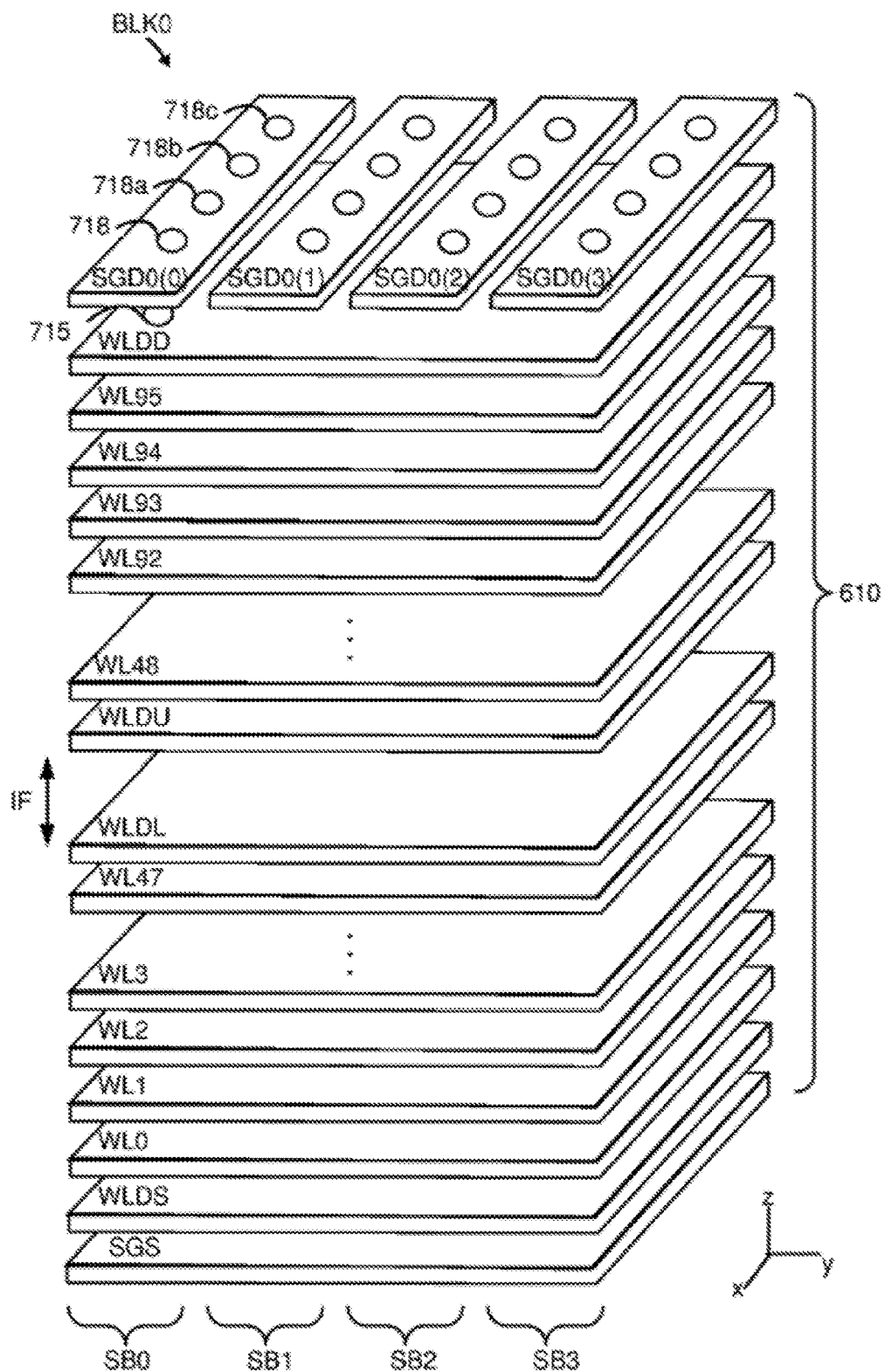
FIG. 6 depicts control gate layers in BLK0 consistent with FIGS. 3-5.

FIG. 6 depicts control gate layers in BLK0 consistent with FIGS. 3-5. The control gate layers are arranged in the stack 610 and include the layers SGS, WLDS, WL0-WL47, WLDL, WLDU, WL48-WL95, WLDD and SGD(0)-SGD(3). The SGS control gate layer is common for the block. Optionally, a separate SGS control gate layer could be provided for each sub-block. Additionally, four example memory holes are depicted in each sub-block. As mentioned, select gate transistors and memory cells can be formed along each memory hole in a NAND string. For example, SGD transistors 718, 718*a*, 718*b* and 718*c* are depicted in SGD0 (0), and a dummy memory cell 715 is depicted in WLDD.

Figure 7:
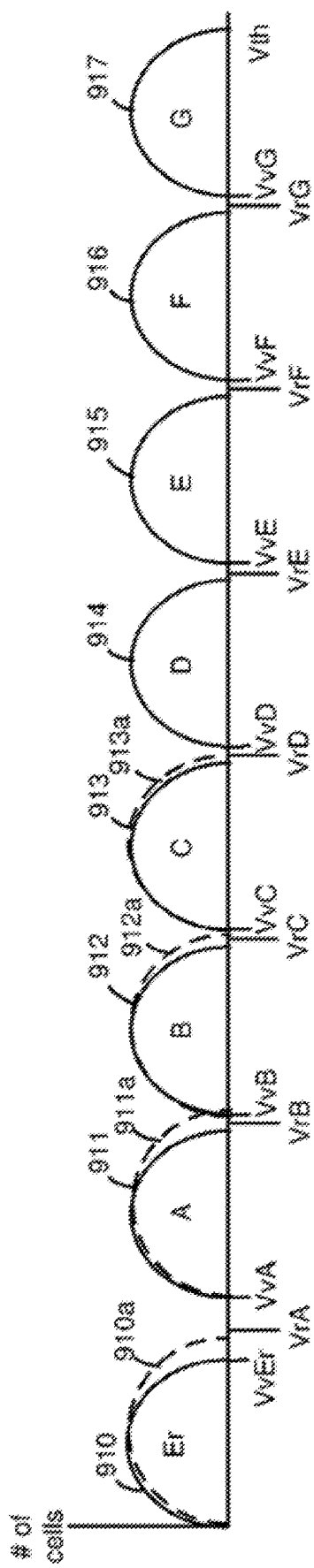
FIG. 7 depicts an example Vth distribution of a set of MLC memory cells in eight data states.

FIG. 7 depicts an example Vth distribution of a set of MLC memory cells in eight data states. The vertical axis depicts a number of memory cells on a logarithmic scale and the horizontal axis depicts the Vth on a linear scale. Initially, at a start of a program operation, the memory cells of a block are all in the erased state, as represented by the Vth distribution 910. In the program operation, the memory cells which are programmed to the A, B, C, D, E, F and G states using verify voltages of VvA, VvB, VvC, VvD, VvE, VvF and VvG, respectively, are represented by the Vth distributions 911, 912, 913, 914, 915, 916 and 917, respectively. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

In an erase operation, the data memory cells transition from the Vth distributions of the programmed data states, e.g., states A-G, to the erased state. The erase operation includes an erase phase in which the memory cells are biased for erasing followed by an erase-verify test which uses an erase verify voltage, VvEr.

As a result of some types of program operations, the memory cells assigned to some of the lower data states, in particular, may experience program disturb. For example, the Er, A, B and C states are represented by the Vth distribution 910*a*, 911*a*, 912*a* and 913*a*, respectively, where the Vth distribution is upshifted due to program disturb as described herein.

One type of program disturb causes residue electrons to remain in the channel region below the charge trap after the program phase of a program operation, as described above. This type of program disturb is sometimes referred to as injection program disturb. The injection of these electrons originates from previous program verify operations, and the amount of injected electrons increases with the program state. This is due to the increased number of program-verify loops required to transfer enough electrons to the charge trap layer to fully charge the gate to the G level. With each program-verify loop, more residual electrons get injected into the channel underneath the charge trap layer. Timing and bias tuning at the word line for each memory cell repulses some of these residual electrons. However, the joint region (referred to above as the interface region) does not have its own word line in some embodiments. In addition, the word lines connected to the dummy memory cells on each side of the joint region (WLDL and WLDU) are not as effective in clearing these residual electrons. Due to the length of the joint region, the lack of a gate over the joint region, and the relative ineffectiveness of the adjacent dummy word lines, residual electrons tend to gather in the joint region.

Figure 8B:
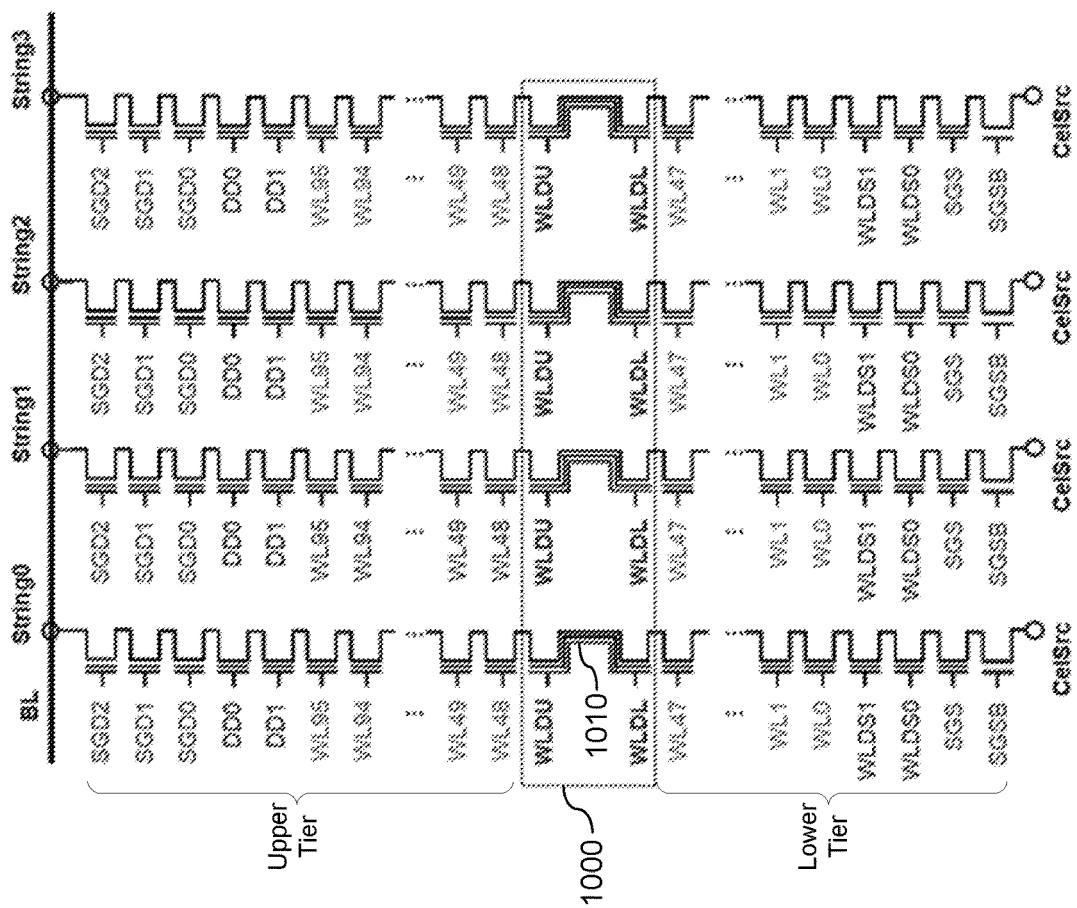
FIGS. 8A and 8B depict an example view of NAND strings in a 3D configuration in accordance with some implementations.
Figure 8A:
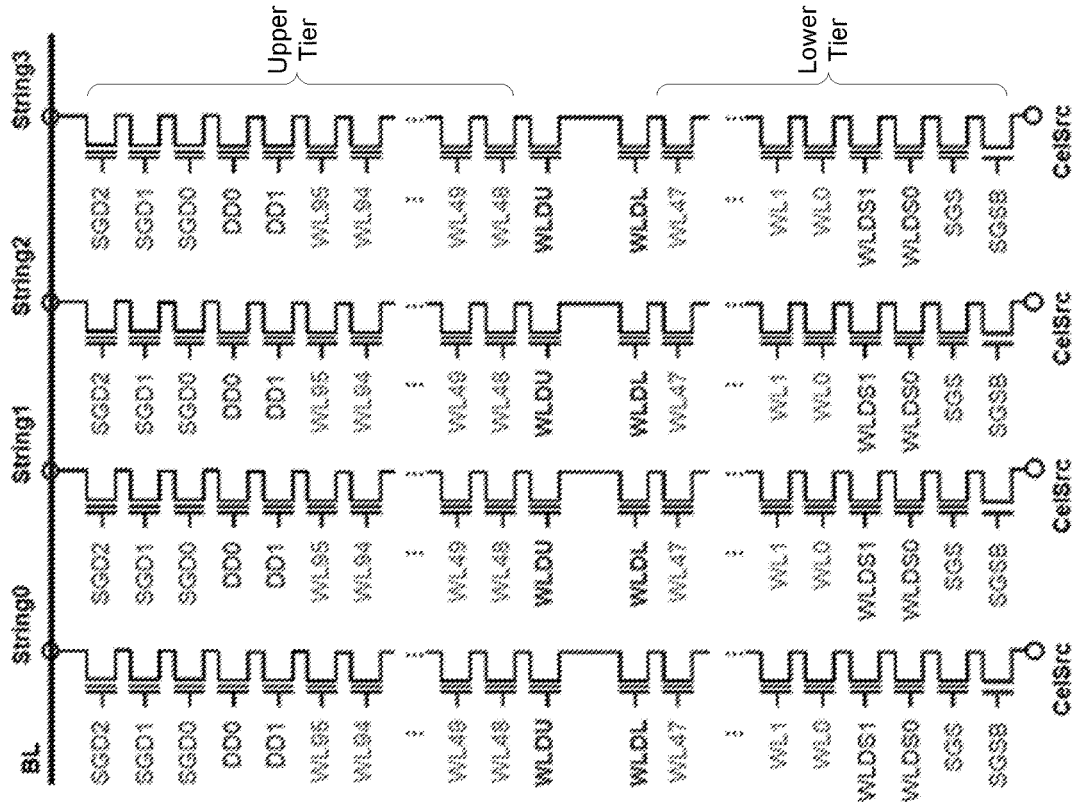

FIG. 8A depicts an example view of NAND strings in a 3D configuration which is consistent with the two-tier stack of FIGS. 3 and 5. FIG. 8B depicts an example view of NAND strings in a 3D configuration which is consistent with the two-tier stack of FIG. 8A, with the addition of a dummy joint gate 1010 in region 1000 (which includes the joint region) of each string. The dummy joint gate is comprised of a metal layer. In some embodiments, the dummy joint gate is an extension of the control gates of the adjacent dummy memory cells WLDU and WLDL.

Figure 9A:
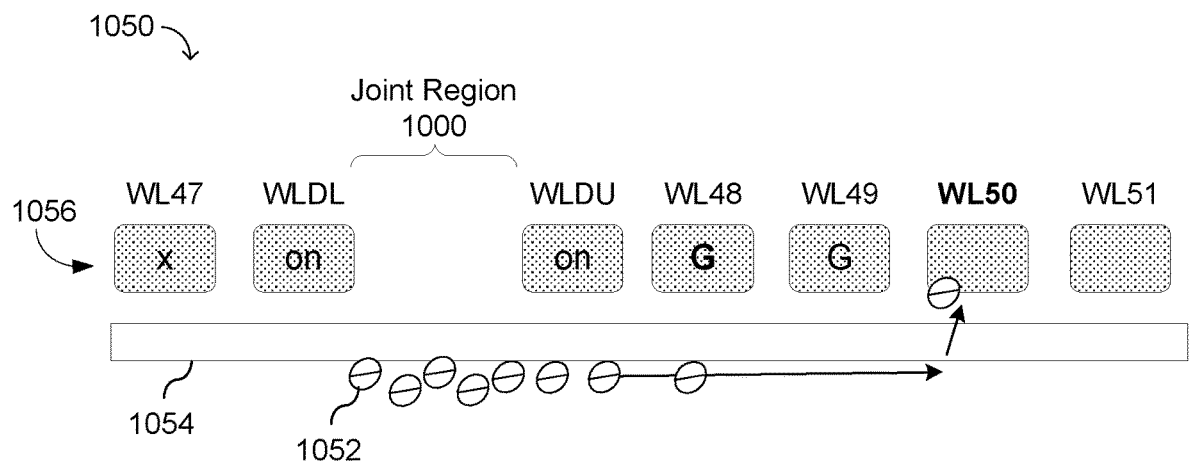
FIGS. 9A and 9B depict an example cross-sectional view of a joint area with neighboring gates in accordance with some implementations.

FIG. 9A depicts an example cross-sectional view 1050 of a joint region 1000 with neighboring gates, consistent with FIG. 8A. The conductive layers 1056 corresponding to each word line are disposed above a charge trap layer 1054, underneath which residual electrons 1052 gather, especially in the joint region. The conductive layers act as word lines which are connected to the memory cells. A dielectric layer (not shown) is disposed between each conductive layer. Due to a desire to increase the height of the stack to allow for more layers and more memory cells in each NAND string, it becomes more difficult to etch low aspect ratio memory holes in which the NAND strings are formed. One approach is to form the stack and memory holes in two (or more) tiers, with each tier separated by a joint region acting as an interface between respective tiers (see, e.g., the upper tiers and lower tiers in FIGS. 8A-8B). A memory hole is etched separately in each tier so that a low aspect ratio can be achieved. However, the dielectric layer or region at the joint region between the tiers is relatively thicker than the other dielectric layers. As a result, the distance between memory cells which are adjacent to the joint region will be greater than the other inter-cell distances.

Because of this increased distance, the channel region at the joint region tends to be less conductive than other channel regions when a pass voltage is applied to the word lines. The conductivity of the channel region at the joint region depends on the strength of a fringing electric field from the word lines which are adjacent to the joint region. However, increasing the voltage of these word lines to a high level to increase the fringing field causes injection program disturb for the associated memory cells. As a result, in the program phase of a program loop, residual electrons 1052 which are initially below the joint region, in the lower tier, will require a relatively long time to travel to the drain end of the NAND string compared to residual electrons which are initially above the joint region, in the upper tier. The residual electrons are attracted to the drain side of the unselected NAND string when a positive bit line voltage is applied. The voltage at the selected word line (e.g., WL50 in FIG. 9A) is relatively high by the time the lower tier residual electrons reach the upper tier, due to the delay in the residual electrons moving through the joint region. This word line voltage attracts the electrons into the charge trapping layer 1054 of the memory cell connected to the selected word line (e.g., WL50), causing a hot electron injection type of program disturb.

Figure 9B:
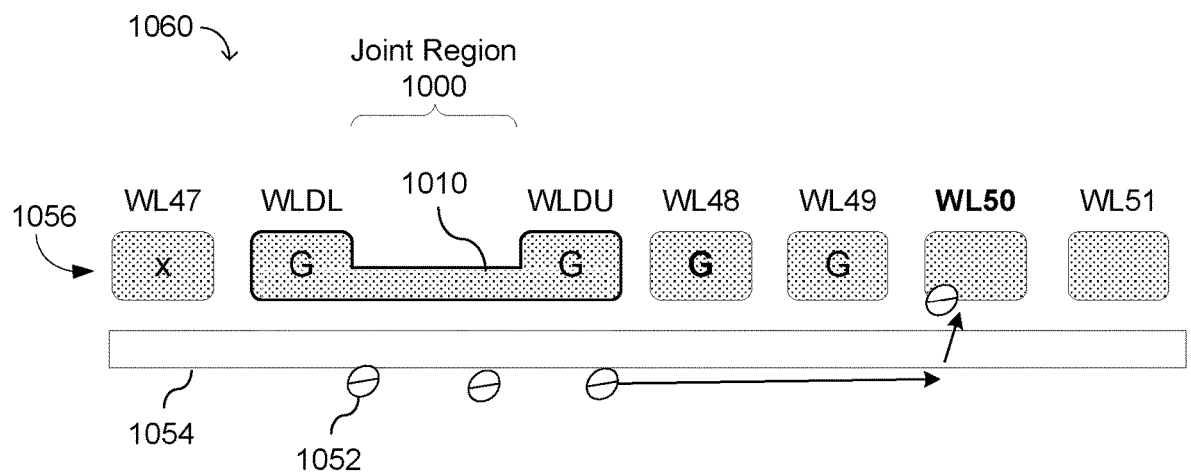

FIG. 9B depicts an example cross-sectional view 1060 of a joint region 1000 with neighboring gates, consistent with FIG. 8B. In FIG. 9B, the dummy gates WLDL and WLDU are joined by a conductive layer, resulting in a combined or unitary dummy joint gate 1010. As a result, the jointed region 1000 can be effectively controlled by the combined dummy joint gate 1010. Therefore, there are less residual electrons 1052 trapped after program verify is complete. Programming WLDU to a higher Vt level helps to drive out the residual electrons 1052 from the joint region 1000 during ramp-down of the voltage applied to the gates during and upon completion of program verify. Stated another way, adding a gate to the joint region allows external bias to be applied to the dummy region (e.g., a negative voltage) which repulses the residual electrons 1052 which are trapped in the channel beneath the charge trap layer 1054. By programming the combined dummy joint gate 1010 to, for example, the G state, the increased external bias more effectively repulses the residual electrons 1052.

The combined WLDU and WLDL gates effectively work as a shorter joint. The dielectric layer disposed in the joint region spans an inter-cell distance between adjacent dummy cells WLDL and WLDU which is larger than the inter-cell distances among the memory cells making up the first tier and second tier. In some embodiments, the inter-cell distance between dummy cells in the joint region (a "second distance") is 1.5 times greater than the inter-cell distance between memory cells within a particular tier of the stack (a "first distance"). Alternatively, the second distance may be as much as 4 times greater than the first distance, more than 4 times greater than the first distance, or less than 1.5 times greater than the first distance. Combining the WLDU and WLDL gates into a combined dummy joint gate allows for an external bias to repulse electrons stuck in the region of the joint, thereby counteracting the effects of the greater joint region inter-cell distance on injection program disturb.

Figure 10:
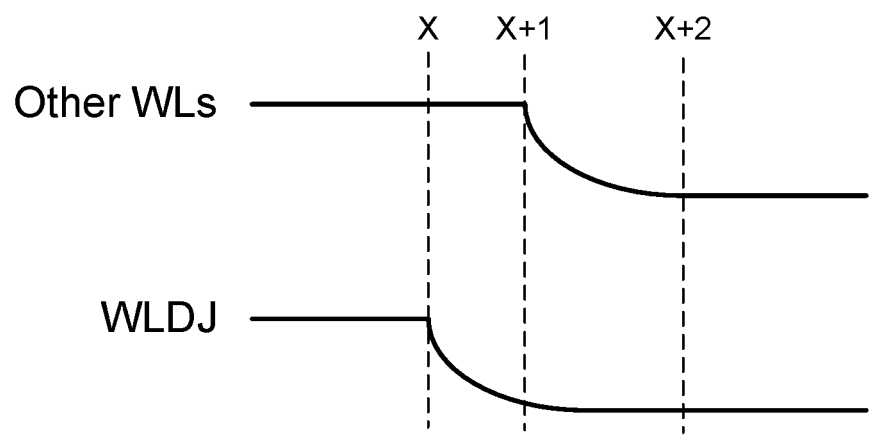
FIG. 10 depicts an example ramp-down timing diagram of a dummy joint gate 1010 versus other word lines.

FIG. 10 depicts an example ramp-down timing diagram of a dummy joint gate 1010 versus other word lines. In some embodiments, following a program verify operation, a voltage at the dummy joint gate 1010 may be ramped down prior to the voltage at other gates. Stated another way, following a program verify operation, a voltage at the dummy joint word line (associated with the dummy joint gate 1010) may be ramped down prior to the voltage at other word lines (associated with one or more memory cells within the first and second tiers). Stated yet another way, a control circuit (e.g., 110, 128, and/or 122) performs a first voltage ramp-down operation on the joint word line (i.e., by causing the voltage on the joint word line to decrease) subsequent to a program verify phase of a program function. After a delay of a non-zero time period with respect to the performing of the first voltage ramp-down operation, the control circuit performs a second voltage ramp-down operation on one or more non-joint word lines connected to one or more respective memory cells (i.e., by causing the voltage on the one or more non-joint word lines to decrease). Referring to the figure, the dummy joint word line voltage is ramped down beginning at time x, while one or more other word line voltages are ramped down beginning at a subsequent time x+1 (i.e., after a delay of a non-zero time period defined by the difference between x and x+1). By the time x+2, all word line voltages have been ramped down. In some embodiments, the voltages at the various word lines are at least substantially ramped down from a program verify voltage to approximately 0V (e.g., 0V+/−0.5V), or at least substantially ramped down to any voltage consistent with a post voltage verify state. Ramping down the dummy joint word line voltage prior to the voltages at other word lines in this manner efficiently pushes the residual electrons out from the joint region at the end of the program verify operation.

Figure 11:
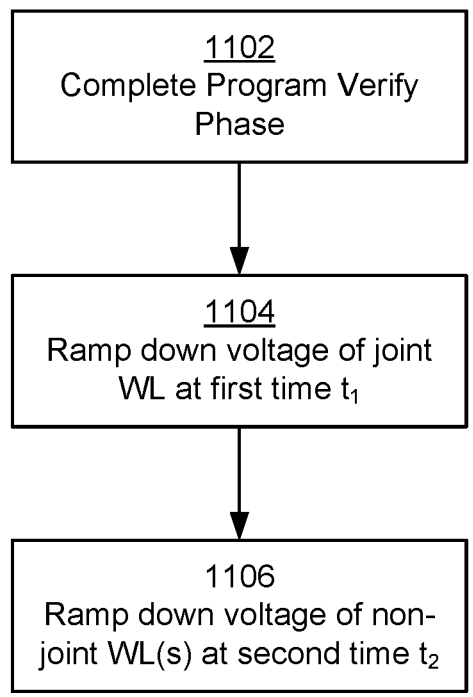
FIG. 11 depicts an example program disturb countermeasure process in accordance with some implementations.

FIG. 11 depicts an example program disturb countermeasure process in accordance with some implementations. The process may be performed at a memory device comprising a NAND string extending in a lower tier and an upper tier of a stack, the lower tier comprising a first plurality of memory cells and the upper tier comprising a second plurality of memory cells, wherein each memory cell of the first and second pluralities of memory cells is connected to a respective word line. The memory device also includes a joint region (e.g., 1000) formed of a dielectric material and disposed between the lower tier and the upper tier of the stack; a first non-data memory cell (e.g., WLDL) adjacent to and below the joint region; a second non-data memory cell (e.g., WLDU) adjacent to and above the joint region; and a conductive gate (e.g., 1010) connected to the first non-data memory cell and the second non-data memory cell, wherein the conductive gate forms a joint word line in electrical contact with a gate of the first non-data memory cell and a gate of the second non-data memory cell.

During a first time interval subsequent to a program verify phase of a program function (1102) (e.g., at a first time $t_1$), a control circuit of the memory device decreases (1104) a voltage of the joint dummy word line. In some embodiments, decreasing the voltage of the joint dummy word line comprises ramping down the voltage of the joint word line from a program verify voltage to approximately 0V (e.g., 0V+/−0.5V).

During a second time interval subsequent to the first time interval (e.g., at a second time t2 subsequent to the first time $t_1$ that, in some embodiments, occurs after a delay of a non-zero time period with respect to the performing of the first voltage ramp-down operation), the control circuit of the memory device decreases (1106) a voltage of one or more non-joint word lines (e.g., any of WL0-WL95) connected to one or more respective memory cells of the second plurality of memory cells. In some embodiments, decreasing the voltage of the one or more non-joint word lines comprises ramping down the voltage of the one or more non-joint word lines from the program verify voltage to approximately 0V (e.g., 0V+/−0.5V).

Embodiments of the memory device architecture described above may mitigate program disturb issues in high aspect ratio of 3D NAND BiCS with 2-tier architectures, as well as n-Tier vertical 3D NAND and BiCS scaling. With the combined WLDU and WLDL joint gates design, the unintentionally trapped charges in the channel below the charge trap layer can be driven out at the joint region, thereby improving string dependent program disturb issues of the cells in the upper word lines. Further, the combined joint dummy gates architecture can effectively improve immunity of channel conduction to height variations of the joint region. The embodiments described above not only improve reliability and performance of multi-tier 3D NAND memory devices, but they also provide for area reduction, since one joint dummy word line driver is sufficient for operation, versus the two required to operate WLDL and WLDU.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is to be appreciated that "smart home environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings, and more generally any living space or work space.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The above description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. An apparatus, comprising:
 a NAND string extending along a lower tier and an upper tier of a stack, the lower tier comprising a first plurality of memory cells and the upper tier comprising a second plurality of memory cells, wherein each memory cell of the first and second pluralities of memory cells is connected to a respective word line;
 a joint region formed of a dielectric material and disposed between the lower tier and the upper tier of the stack;
 a first non-data memory cell adjacent to and below the joint region;
 a second non-data memory cell adjacent to and above the joint region; and
 a conductive gate extending through the joint region and connecting to a gate of the first non-data memory cell and a gate of the second non-data memory cell.

2. The apparatus of claim 1, wherein the conductive gate forms a joint word line in electrical contact with a gate of the first non-data memory cell and a gate of the second non-data memory cell.

3. The apparatus of claim 2, further comprising:
 a control circuit configured to:
   subsequent to a program verify phase of a program function, perform a first voltage ramp-down operation on the joint word line; and
   after a delay of a non-zero time period with respect to the performing of the first voltage ramp-down operation, perform a second voltage ramp-down operation on one or more non-joint word lines connected to one or more respective memory cells of the second plurality of memory cells.

4. The apparatus of claim 3, wherein:
 decreasing the voltage of the joint word line comprises ramping down the voltage of the joint word line from a program verify voltage to approximately 0V; and
 decreasing the voltage of the one or more non-joint word lines comprises ramping down the voltage of the one or more non-joint word lines from the program verify voltage to approximately 0V.

5. The apparatus of claim 1, wherein:
 the first non-data memory cell is connected to a first dummy word line adjacent to and below the joint region;
 the second non-data memory cell is connected to a second dummy word line adjacent to and above the joint region; and the conductive gate electrically connects the first dummy word line to the second dummy word line.

6. The apparatus of claim 1, wherein the first and second non-data memory cells are dummy memory cells ineligible to store user data.

7. The apparatus of claim 1, wherein:
the first non-data memory cell is disposed in the lower tier of the stack; and
the second non-data memory cell is disposed in the upper tier of the stack.

8. The apparatus of claim 1, wherein:
adjacent memory cells in the first plurality of memory cells are separated by a first inter-cell distance;
adjacent memory cells in the second plurality of memory cells are separated by the first inter-cell distance;
the joint region includes a dielectric layer spanning a second inter-cell distance between the first non-data memory cell and the second non-data memory cell; and
the second inter-cell distance is greater than the first inter-cell distance by at least a factor of 1.5.

9. A method, comprising:
at an apparatus comprising:
a NAND string extending in a lower tier and an upper tier of a stack, the lower tier comprising a first plurality of memory cells and the upper tier comprising a second plurality of memory cells, wherein each memory cell of the first and second pluralities of memory cells is connected to a respective word line;
a joint region formed of a dielectric material and disposed between the lower tier and the upper tier of the stack;
a first non-data memory cell adjacent to and below the joint region;
a second non-data memory cell adjacent to and above the joint region; and
a conductive gate connected to the first non-data memory cell and the second non-data memory cell;
wherein the conductive gate forms a joint word line in electrical contact with a gate of the first non-data memory cell and a gate of the second non-data memory cell:
subsequent to a program verify phase of a program function, performing a first voltage ramp-down operation on the joint word line; and
after a delay of a non-zero time period with respect to the performing of the first voltage ramp-down operation, performing a second voltage ramp-down operation on one or more non-joint word lines connected to one or more respective memory cells of the second plurality of memory cells.

10. The method of claim 9, wherein:
performing the first voltage ramp-down operation comprises ramping down the voltage of the joint word line from a program verify voltage to approximately 0V; and
performing the second voltage ramp-down operation comprises ramping down the voltage of the one or more non-joint word lines from the program verify voltage to approximately 0V.

11. The method of claim 9, wherein the conductive gate forms a joint word line in electrical contact with a gate of the first non-data memory cell and a gate of the second non-data memory cell.

12. The method of claim 9, wherein:
the first non-data memory cell is connected to a first dummy word line adjacent to and below the joint region;
the second non-data memory cell is connected to a second dummy word line adjacent to and above the joint region; and
the conductive gate electrically connects the first dummy word line to the second dummy word line.

13. The method of claim 9, wherein the first and second non-data memory cells are dummy memory cells ineligible to store user data.

14. The method of claim 9, wherein:
the first non-data memory cell is disposed in the lower tier of the stack; and
the second non-data memory cell is disposed in the upper tier of the stack.

15. The method of claim 9, wherein:
adjacent memory cells in the first plurality of memory cells are separated by a first inter-cell distance;
adjacent memory cells in the second plurality of memory cells are separated by the first inter-cell distance;
the joint region includes a dielectric layer spanning a second inter-cell distance between the first non-data memory cell and the second non-data memory cell; and
the second inter-cell distance is greater than the first inter-cell distance by at least a factor of 1.5.

16. An apparatus, comprising:
a NAND string extending along a lower tier and an upper tier of a stack, the lower tier comprising a first plurality of memory cells and the upper tier comprising a second plurality of memory cells, wherein each memory cell of the first and second pluralities of memory cells is connected to a respective word line;
a joint region formed of a dielectric material and disposed between the lower tier and the upper tier of the stack;
a first non-data memory cell adjacent to and below the joint region;
a second non-data memory cell adjacent to and above the joint region;
a conductive gate extending through the joint region and connecting to the first non-data memory cell and the second non-data memory cell, wherein the conductive gate forms a joint word line in electrical contact with a gate of the first non-data memory cell and a gate of the second non-data memory cell;
means for performing, subsequent to a program verify phase of a program function, a first voltage ramp-down operation on the joint word line; and
means for performing, after a delay of a non-zero time period with respect to the performing of the first voltage ramp-down operation, a second voltage ramp-down operation on one or more non-joint word lines connected to one or more respective memory cells of the second plurality of memory cells.

17. The apparatus of claim 16, wherein:
the means for performing the first voltage ramp-down operation comprise means for ramping down the voltage of the joint word line from a program verify voltage to approximately 0V; and
the means for performing the second voltage ramp-down operation comprise means for ramping down the voltage of the one or more non-joint word lines from the program verify voltage to approximately 0V.

18. The apparatus of claim 16, wherein:
the first non-data memory cell is connected to a first dummy word line adjacent to and below the joint region;
the second non-data memory cell is connected to a second dummy word line adjacent to and above the joint region; and
the conductive gate electrically connects the first dummy word line to the second dummy word line.

19. The apparatus of claim 16, wherein the first and second non-data memory cells are dummy memory cells ineligible to store user data.

20. The apparatus of claim 16, wherein:
adjacent memory cells in the first plurality of memory cells are separated by a first inter-cell distance;
adjacent memory cells in the second plurality of memory cells are separated by the first inter-cell distance;
the joint region includes a dielectric layer spanning a second inter-cell distance between the first non-data memory cell and the second non-data memory cell; and
the second inter-cell distance is greater than the first inter-cell distance by at least a factor of 1.5.

\* \* \* \* \*